(12) United States Patent
Moe (10) Patent No.: US 10,890,613 B2
(45) Date of Patent: Jan. 12, 2021

(54) METHODS AND SYSTEMS FOR ANALYZING CABLE RETURN LOSS

(71) Applicant: CommScope Technologies LLC, Hickory, NC (US)

(72) Inventor: Alan N. Moe, Hickory, NC (US)

(73) Assignee: CommScope Technologies LLC, Hickory, NC (US)

( * ) Notice: Subject to any disclaimer, the term of this patent is extended or adjusted under 35 U.S.C. 154(b) by 28 days.

(21) Appl. No.: 16/189,316

(22) Filed: Nov. 13, 2018

(65) Prior Publication Data

US 2019/0146023 A1 May 16, 2019

Related U.S. Application Data

(60) Provisional application No. 62/585,568, filed on Nov. 14, 2017.

(51) Int. Cl.
| | |
|---|---|
| *G01R 31/08* | (2020.01) |
| *G01P 3/36* | (2006.01) |
| *G01P 3/486* | (2006.01) |
| *G01R 31/59* | (2020.01) |
| *G01R 27/32* | (2006.01) |

(52) U.S. Cl.
CPC .......... *G01R 31/083* (2013.01); *G01P 3/363* (2013.01); *G01P 3/486* (2013.01); *G01R 31/59* (2020.01); *G01R 27/32* (2013.01)

(58) Field of Classification Search
CPC ...... G01R 31/083; G01R 31/59; G01R 27/32; G01P 3/363; G01P 3/486; G01N 21/8806; G01N 21/8803
See application file for complete search history.

(56) References Cited

U.S. PATENT DOCUMENTS

| | | | | |
|---|---|---|---|---|
| 6,313,909 B1* | 11/2001 | Frazee, Jr. | ............. | G01M 11/37 356/73.1 |
| 6,559,936 B1* | 5/2003 | Colombo | ............. | G01B 11/275 33/288 |
| 2002/0092994 A1* | 7/2002 | Kitamura | .......... | B29C 66/12821 250/559.29 |
| 2015/0042355 A1* | 2/2015 | Silva | ...................... | G01R 27/20 324/509 |
| 2018/0045768 A1* | 2/2018 | Godfrey | ............... | G01R 31/083 |

* cited by examiner

*Primary Examiner* — Jeff W Natalini
(74) *Attorney, Agent, or Firm* — Myers Bigel, P.A.

(57) ABSTRACT

Detecting the source of a defect in a cable may be difficult, in part because present systems may be configured to wind and unwind the cable on many different spools, capstans or other transport equipment. Provided are systems and methods in which a laser speed gauge is used to measure the rotation of a cable assembly component and determine any abnormalities in the rotation (e.g., vibrations, periodic increases/decreases in speed). An example method includes receiving, by a computing device and from a laser speed gauge, a first reading of a rotating cable assembly component. The computing device may covert the first reading of the rotating cable assembly component to a frequency analysis of the rotating cable assembly component and determine based on the frequency analysis of the rotating cable assembly component, a structural defect in a cable caused by the rotating cable assembly component.

13 Claims, 8 Drawing Sheets

METHODS AND SYSTEMS FOR ANALYZING CABLE RETURN LOSS

CROSS-REFERENCE TO RELATED APPLICATION

The present application claims priority under 35 U.S.C. § 119 to U.S. Provisional Application No. 62/585,568, filed on Nov. 14, 2017 and entitled "METHODS AND SYSTEMS FOR ANALYZING CABLE RETURN LOSS," the entire contents of which are incorporated by reference herein for all purposes.

FIELD

The present disclosure relates to manufacturing cable for use in communications systems and assemblies, such as in cellular communications systems and base station antennas.

BACKGROUND

In order to increase capacity and speed in cellular communications systems, cellular operators have been deploying base stations and mobile equipment compatible with the Long-Term Evolution (LTE) standard. One aspect of the LTE standard is the availability of different frequencies and frequency bands than in previous standards (e.g., GSM/EDGE, UMTS/HSPA, CDMA2000). These frequencies and frequency bands may be used in different locations and nations.

Typically, baseband equipment, radios, and antennas that are part of these cellular communications systems are connected via cabling, such as coaxial cabling. This cabling enables a signal or signals to propagate between the various described equipment, and therefore must provide an acceptable level of service with a minimal loss of signal (e.g., minimal noise). An increase in the number of frequencies and frequency bands, as well as the requirements of the communication standard have prompted cable manufacturers wishing to sell cable for use in LTE networks/systems, and/or installation designers and operators purchasing such cable, to take steps to ensure that the cable to be used in a LTE network is capable of meeting the demands of the LTE network. Cable manufacturers, in particular, have installed or upgraded production lines to satisfy the demand for LTE-capable cables, in some cases making significant capital investments.

SUMMARY

Some aspects of the present disclosure provide methods and systems for analyzing the return loss of a cable. For example, some aspects provide a method that may include: receiving, by a computing device and from a laser speed gauge, a first reading of a cable assembly component. The method may also include converting, by the computing device, the first reading of the cable assembly component to a frequency analysis of the cable assembly component. The method may also include determining, based on the frequency analysis of the cable assembly component, a structural defect in a cable caused by the cable assembly component.

Some aspects of the present disclosure may include one or more of the following features. The method may include: receiving, by the computing device, a second reading of the cable assembly component. The method may also include converting, by the computing device, the second reading of the cable assembly component to a further frequency analysis of the cable assembly component. The method may also include determining that the structural defect is based on the frequency analysis and the further frequency analysis. Determining that the structural defect is based on the frequency analysis and the further frequency analysis may be based on an average of the frequency analysis and the further frequency analysis. The method may include aspects where the first reading of the cable assembly component is associated with a first rotational speed of the cable assembly component, and aspects where the second reading of the cable assembly component is associated with a second rotational speed of the cable assembly component that is different from the first rotational speed.

Determining that there is a structural defect in a cable caused by the cable assembly component may include comparing the frequency analysis of the cable assembly component with a frequency analysis of the cable. A frequency analysis of the cable may include analysis of the cable over a range of frequencies that includes a long-term evolution (LTE) frequency. The cable assembly component may be a capstan.

Some aspects of the present disclosure provide a method that may include: receiving, by a computing device and from a laser speed gauge, a first reading of a cable assembly component; converting, by the computing device, the first reading of the cable assembly component to a frequency analysis of the cable assembly component; determining, based on the frequency analysis of the cable assembly component, a structural defect in a cable caused by the cable assembly component; receiving, by the computing device, a second reading of the cable assembly component; converting, by the computing device, the second reading of the cable assembly component to a further frequency analysis of the cable assembly component; and determining a structural defect in a cable caused by the cable assembly component. The determining of the structural defect in the cable may be based on the frequency analysis of the cable assembly component, the further frequency analysis of the cable assembly component, and a comparison of the frequency analysis of the cable assembly component with a frequency analysis of the cable.

Some aspects of the present disclosure may include one or more of the following features. Determining of the structural defect in the cable may be based on an average of the frequency analysis and the further frequency analysis. The first reading of the cable assembly component may be associated with a first rotational speed of the rotating capstan, and the second reading of the cable assembly component may be associated with a second rotational speed of the cable assembly component that is different from the first rotational speed. The frequency analysis of the cable may include analysis of the cable over a range of frequencies that includes a LTE frequency. The cable assembly component may be a capstan.

Some aspects include corresponding computer systems, apparatus, and computer programs recorded on one or more computer storage devices, each configured to perform the actions of the methods and/or techniques described herein. For example, some aspects provide a system that may include: a computing device including a processor and memory coupled to the processor. The system may also include a laser speed gauge. The memory may non-transitory computer readable instructions that when executed by the processor cause the processor to perform operations. The operations may include receiving, from the laser speed gauge, a first reading of a cable assembly component;

converting the first reading of the cable assembly component to a frequency analysis of the cable assembly component; and determining, based on the frequency analysis of the cable assembly component, a structural defect in a cable caused by the cable assembly component.

DETAILED DESCRIPTION

The description provided herein is best appreciated with reference to the accompanying drawings, in which certain exemplary embodiments are shown. Aspects of the present disclosure may, however, be embodied in many different forms and should not be construed as limited to the exemplary embodiments that are pictured and described herein. Rather, these illustrated embodiments are provided so that this disclosure will be thorough and complete, and will fully convey the scope of the teachings provided herein to those skilled in the art. It will also be appreciated that the embodiments illustrated herein may be combinable in any way and/or combination to provide many additional embodiments.

Unless otherwise defined, all technical and scientific terms that are used in this disclosure have the same meaning as commonly understood by one of ordinary skill in the field to which this disclosure belongs. The terminology used in the below description is for the purpose of describing particular embodiments only and is not intended to be limiting. As used in this disclosure, the singular forms "a", "an" and "the" are intended to include the plural forms as well, unless the context clearly indicates otherwise. It will also be understood that when an element (e.g., a device, circuit, etc.) is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Figure 1:
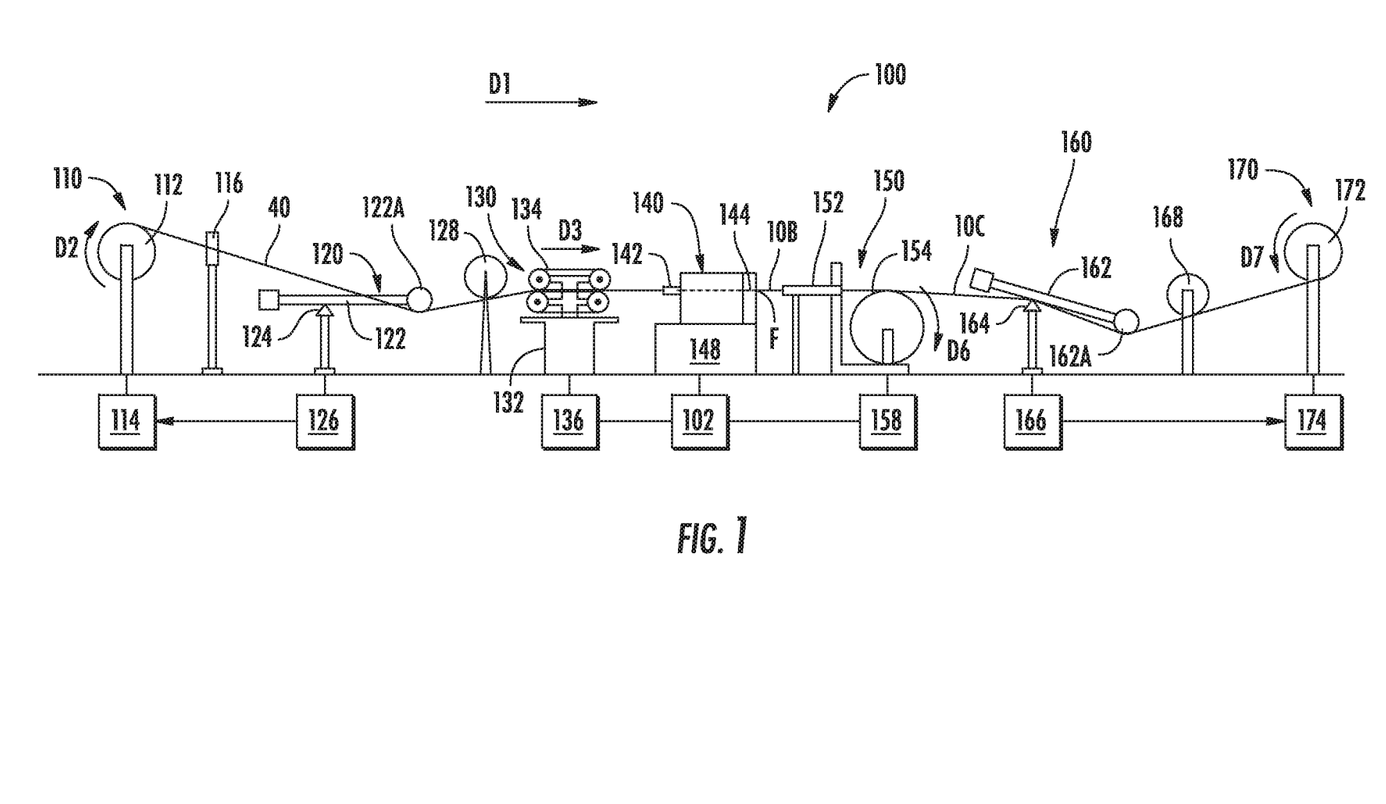
FIG. 1 is a schematic view of an example assembly line for forming a cable assembly.

With reference to FIG. 1, an example assembly line apparatus 100 is shown therein. The apparatus 100 may be used to form various types of cable. As illustrated in FIG. 1, the assembly line apparatus 100 includes various components, but each of these may be optional and not present in various embodiments. The assembly line apparatus 100 of FIG. 1 is merely an example apparatus 100 that may be used with the inventive concepts of the present application, and other cable or wire forming apparatuses may be used in place of, in addition to, and/or in conjunction with the inventive concepts provided herein. The apparatus 100 includes generally and in series: a controller 102; a payoff apparatus 110; an idler roller 116; a feed tensioner 120; an idler roller 128; a cable feed apparatus 130; a jacketing apparatus 140; an exit capstan apparatus 150; a take-up tensioner 160, an idler roller 168; and a take-up apparatus 170. The assembly line 100 may enable a continuous, sequential process proceeding from the payoff apparatus 110 to the take-up apparatus 170 in a flowpath direction D1. The cable 40 may engage and pass through, over or under each of the apparatus 110, 116, 120, 128, 130, 140, 150, 160, 168, 170.

The payoff apparatus 110 includes a reel 112 and a motor 114 operable to drive the reel 112 in a rotational direction D2. A supply of the cable 40 may be pre-wound on the reel 112 in known manner, for example.

The feed tensioner 120 may include a dancer 122 having an engagement roller 122A on one end thereof. The dancer 122 may be pivotally mounted on a fulcrum 124. The cable 40 may be routed from the reel 112, over the idler roller 116, and under the roller 122A such the dancer 122 supports the cable 40. A sensor 126 may be operably connected to the dancer 122 to measure a tension on the cable 40. The sensor 126 may communicate with the motor 114 to control the rate of payoff from the payoff apparatus 110 to maintain the tension of the cable 40 in a desired range.

The cable 40 is further routed from the tensioner apparatus 120 to the cable feed apparatus 130. According to some embodiments and as illustrated, the cable feed apparatus 130 is a driven capstan. The cable feed apparatus 130 includes a stand 132 and a pair of opposed conveyor belts 134 mounted on the stand 132. A motor 136 is operable to drive the conveyor belts 134 in opposed rotational directions. The motor 136 may be controlled by the controller 102. In use, the cable 40 is routed through the cable feed apparatus 130 such that the conveyor belts 134 sandwich and engage the cable 40 and, by rotating in the opposed rotational directions, drive the cable 40 in a downstream direction D3. The conveyor belts 134 may be mounted on driven rollers, for example. Other mechanisms may be used to engage and forcibly drive the cable 40, such as opposed driven rollers.

According to some embodiments, the cable feed apparatus 130 is replaced with a single wheel capstan (e.g., similar to the exit capstan 150) that the cable 40 wraps around to enable sufficient contact between the cable and the capstan to forcibly feed the cable 40. This embodiment may be beneficial because the capstan will engage all components in the cable 40 whereas the belts 134 may put tension on the cable 40 and stretch the cable 40.

Figure 5:
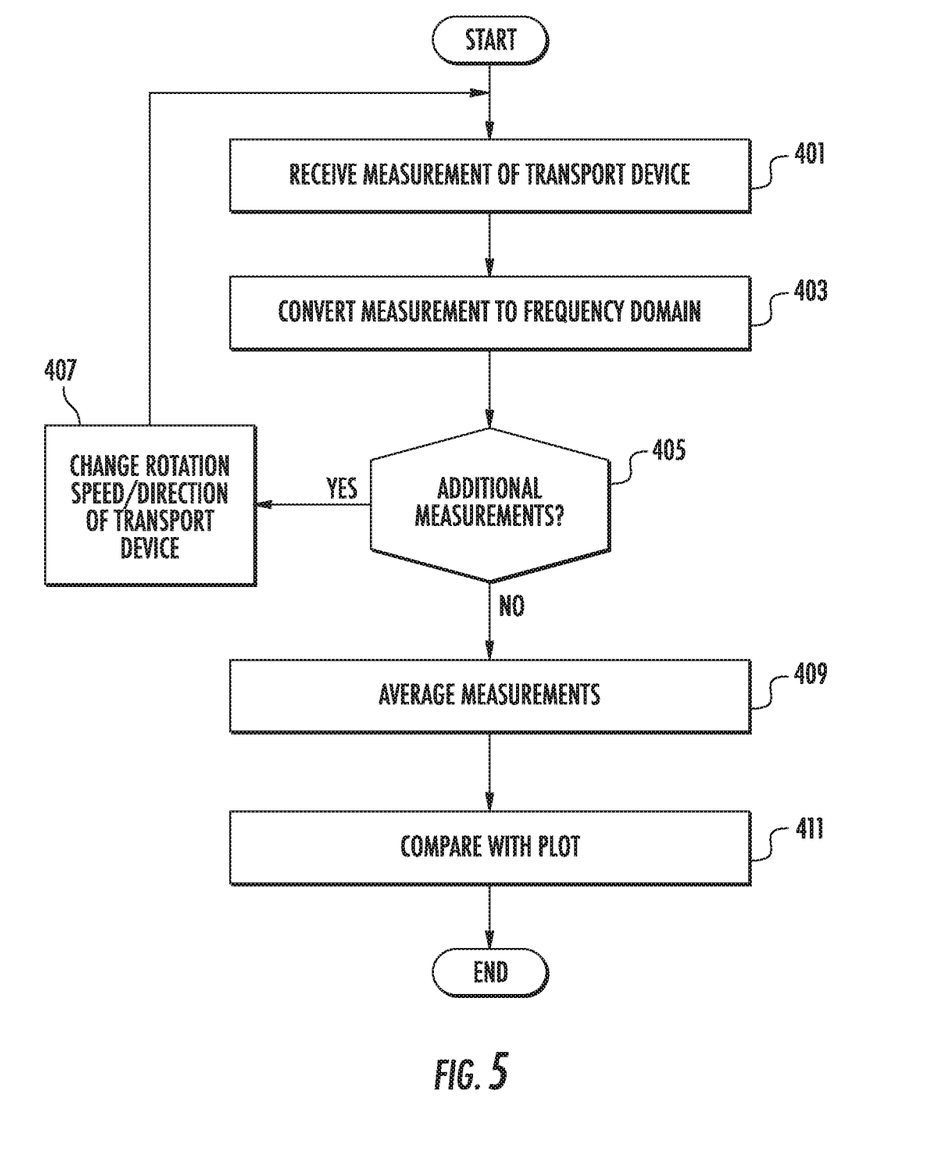
FIG. 5 is an exemplary process flowchart of analyzing a capstan using the system of FIG. 3.

The cable 40 is thereafter routed downstream to the jacketing apparatus 140 (FIG. 5). The jacketing apparatus 140 may be any suitable device for forming a jacket around the cable. According to some embodiments, the jacketing apparatus 140 may comprise a strip or roll apparatus. The cable 40 is routed out of the jacketing apparatus 140 through the forming location F such that the jacket is formed circumferentially about the cable 40 at the forming location F.

The exit capstan apparatus 150 (FIG. 2) may include a guide 152, a capstan wheel 154, idler rollers 156, and a motor 158. The capstan wheel 154 has a peripheral circumferential surface 154A and opposed peripheral side flanges 154B. The motor 158 is operable to drive the capstan wheel 154 in a rotational direction D6. The motor 158 may be controlled by the controller 102. The cable 40 and the jacket are routed from the forming location F, through the guide tube 152, circumferentially around the capstan wheel 154, and then further downstream. According to some embodiments, the cable 40 and the jacket are wrapped around the capstan wheel 154 at least one full revolution (i.e., at least 360°), and according to some embodiments, a plurality of revolutions.

The take-up tensioner 160 includes a dancer 162 having an engagement roller 162A on one end thereof. The dancer 162 is pivotally mounted on a fulcrum 164. The cable 40 and the jacket are routed from the capstan wheel 154, under the roller 162A such the dancer 122 supports the cable 40 and the jacket, over the idler roller 168, and to the take-up apparatus 160. A sensor 166 is operably connected to the dancer 162 to measure a tension on the cable 40.

The take-up apparatus 170 includes a reel 172 and a motor 174 operable to drive the reel 172 in a rotational direction D7 to wind the cable 40 onto the reel 172. The sensor 166 communicates with the motor 174 to control the rate of take-up onto the take-up apparatus 170 to maintain the tension of the cable 40 in a desired range.

In summary, in use, the cable 40 (or components thereof) is paid off from the reel 112 and routed through the jacketing location F, where the jacket is formed about the cable 40. The combined cable 40 and jacket are then drawn downstream by the exit capstan apparatus 150 and onto the reel 172. During this process, the tension in the cable 40 between the reel 112 and the cable feed apparatus 130 may be controlled by the sensor 126 and the payoff motor 114, and the tension in the cable 40 with the jacket between the reel 172 and the exit capstan apparatus 150 may be controlled by the sensor 166 and the take-up motor 174.

One particular problem known in the production and usage of cables for use in communications systems is return loss. Return loss is measurable either relative to the average cable impedance (in the case of structural return loss) or relative to a nominal cable impedance (e.g., 75 ohms). Signals transmitted by cable may encounter a discontinuity or impedance variation while traversing the cable, and an echo or return may result increasing noise in the cable by creating potential sources of additive and destructive interference in the cable. There are various sources of returns in a cable, such as, for example, the choice of the materials used to manufacture the cable (e.g., the conductors, the insulators, dielectric mediums interposed between conductors, shielding elements, jacket manufacturing, and so on), and in using the cable (e.g., exceeding the bend radius of the cable, exceeding a pull strength of the cable, and so on). However, of particular concern herein are returns caused by the manufacturing techniques of the cable, in particular those caused by spooling components in the manufacturing process.

Due to size and space constraints, multiple operations on a wire or cable (e.g., reducing a diameter of a conductor, inserting a cable assembly into a shield or jacket) may be interposed with winding and unwinding of the wire or cable on substantially cylindrical capstans or other substantially cylindrical devices (e.g., spools).

Figure 2:
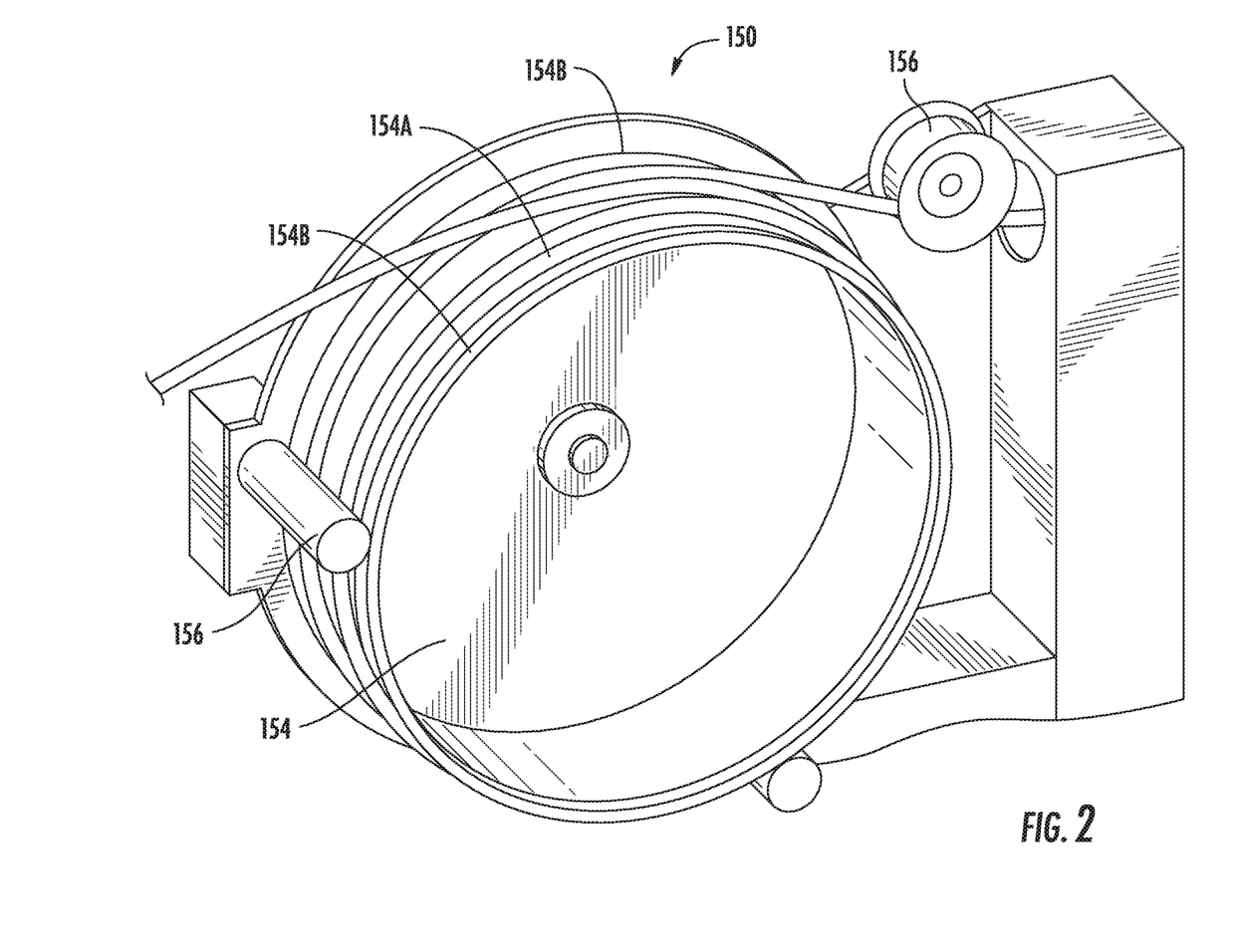
FIG. 2 illustrates a cable capstan.

It has been identified that transport equipment (such as the payoff apparatus 110; the idler roller 116; the feed tensioner 120; the idler roller 128; the cable feed apparatus 130; the jacketing apparatus 140; the exit capstan apparatus 150; the take-up tensioner 160, the idler roller 168; and the take-up apparatus 170 of the example apparatus 100 of FIG. 1, including the example capstan 150 illustrated in FIG. 2) may be a contributing cause to both the speed variations in various manufacturing production lines (e.g., a welding line, a main line, and so on). Such speed variations may result in returns in a manufactured cable, because the cable may be bent, twisted, lengthened, shortened, or otherwise physically altered by a speed variation in one or more pieces of the transport equipment. It has been recognized that the transport equipment, and even a minor variation in the operation of the transport equipment presents a potential source of return loss in a cable manufactured via winding, unwinding, tensioning, bending, twisting, and other operations of the cable by the transport equipment. For example, small speed variations caused by a worn gear, gearbox, belt, pulley, bearing, or the like, or misaligned shafts, excessive wear, unbalanced conditions, and so on may create a periodic discontinuity (e.g., approximately every $2\pi r$ meters along the length of the cable, where r is the radius of the capstan measured in meters) as the transport equipment momentarily increases or decreases its turning speed. Nonperiodic discontinuities are also possible, and may occur during loading, unloading, spooling, unspooling, and so on.

It has also been recognized that characterizing the speed variations of a transport equipment (which may be referred to herein as cable assembly equipment or a a cable assembly component) or manufactured component is desirable, and that such characterization needs to be accurate over a wide range of vibratory frequencies. As discussed above, a greater range of transmission frequencies are possible in the LTE space. In the past, mechanical encoders with frequency to voltage converters were used as the input sensors for measuring periodic speed variation in production line systems. These mechanical encoders were typically installed at one or two points on the line. The mass of the cable assembly equipment and the design of the encoder limited the frequency range over which the data was available. For example, previously known tension measurement devices include load cells attached to large pulleys. Such systems were typically designed to measure the tension for the purpose of allowing a line operator to set up to a specific line tension and were not designed either mechanically or electrically to be able to measure product detect tension variations at the frequencies needed for the purpose of troubleshooting return loss in a cable.

Accordingly, provided herein is a method of measuring and documenting speed variations in cable assembly components or cable transport equipment. These small speed variations can be caused by many sources, including gearbox design, gear geometry, belts, pulleys, worn bearings or misaligned shafts, excessive wear, unbalance conditions, vibrations, and so on. In some aspects, it is preferable that the capstan operate in a stand-alone, non-cable producing mode. However, in some aspects, defects in the cable may result from interactions between transport devices (e.g., two or more of the payoff apparatus 110; the idler roller 116; the feed tensioner 120; the idler roller 128; the cable feed apparatus 130; the jacketing apparatus 140; the exit capstan apparatus 150; the take-up tensioner 160, the idler roller 168; and the take-up apparatus 170 of the example apparatus 100 of FIG. 1). For example, overtensioning of the cable may result from interactions between two or more devices. Accordingly, in some aspects, the devices may be operating in a cable-producing mode (e.g., a production mode) when analyzed.

The inventors have also recognized that mapping the speed variational spectra of the transport equipment may be an accurate way to characterize the potential for these devices to cause quality defects within the cable. It has been determined that the amplitude and frequency of the Fast Fourier Transform (FFT) of the speed variation of the transport equipment, as measured by a laser speed gauge, was found to correlate directly with the finished cable defect frequency and approximate dB level in the finished cable. Both tension and speed variations may be defined as a function of frequency. Of importance is the capability of the system under discussion to be able to measure the speed amplitude vs frequency with sufficient accuracy for FFT analysis while simultaneously preserving the amplitude vs frequency information across a frequency range of interest.

The analog output of a laser Doppler speed measurement system may be used as the input to a dynamic signal analyzer. This technique may permit diagnosis of a cable at a root cause level and to use it to characterize defects in a cable and associate the defects with the offending transport equipment. As provided herein, this technique can allow for root cause troubleshooting to take place inside the transport machines themselves to find the part (e.g., gearbox, gear, bearing, or the like) that is causing the problem. In other words, a component or subcomponent of the payoff apparatus 110; the idler roller 116; the feed tensioner 120; the idler roller 128; the cable feed apparatus 130; the jacketing apparatus 140; the exit capstan apparatus 150; the take-up tensioner 160, the idler roller 168; and the take-up apparatus 170 of the example apparatus 100 of FIG. 1 may be examined.

Another component of the technique is to preserve the amplitude calibration of the FFTs of the transport equipment and to create a library of "laser speed maps" or spectra for historical reference. Another component of the technique is to be able to identify the root cause despite the velocity of propagation of the cable being made or the position of the transport equipment within the manufacturing process.

Figure 3:
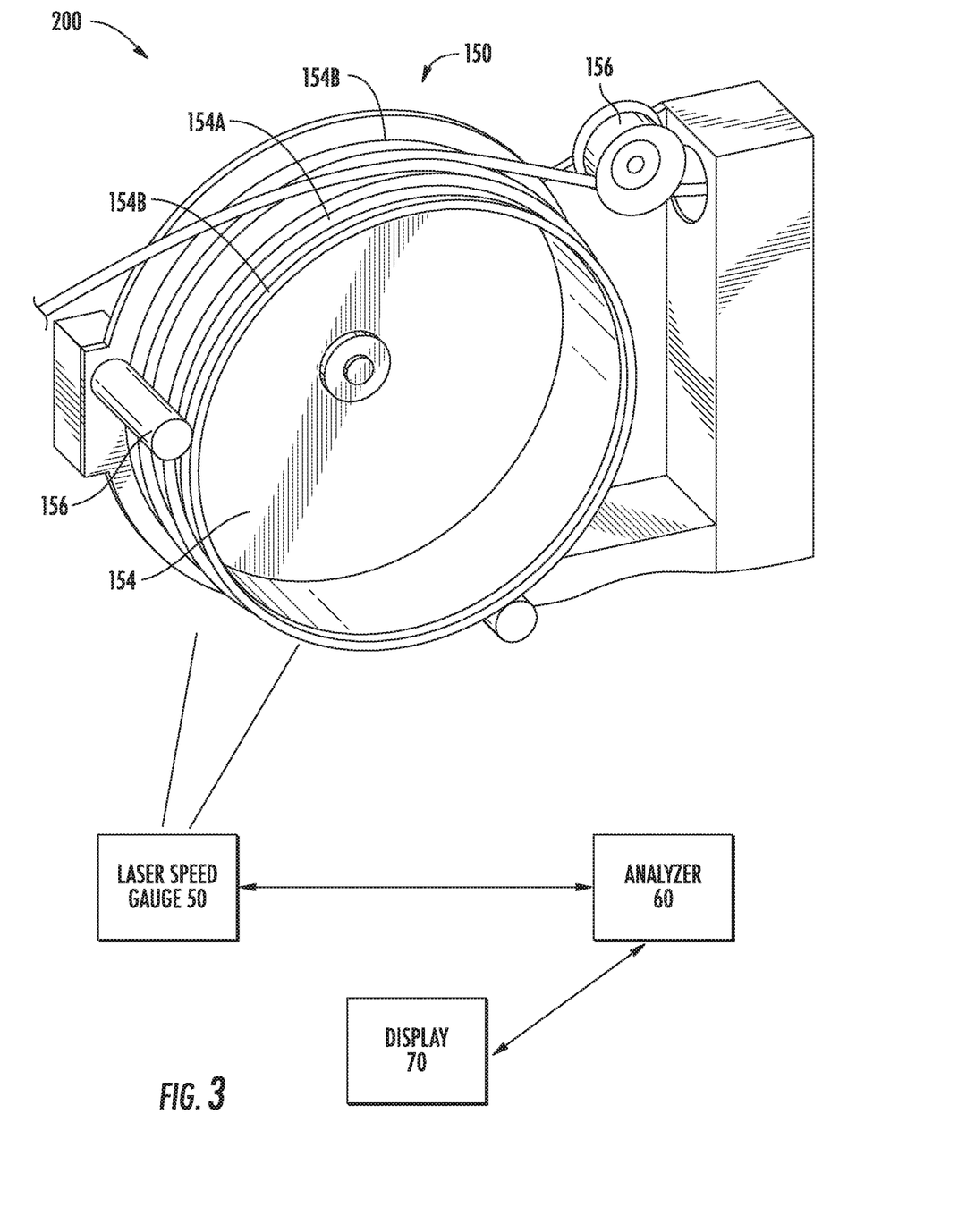
FIG. 3 illustrates an example system according to the present disclosure of analyzing the cable capstan of FIG. 2.

Accordingly, as illustrated in FIG. 3, which shows the system 200 of the present disclosure, the speed of capstan 150 may be measured using a non-contact laser Doppler speed gauge 50, which may be referred to herein as a "speed gauge" or "laser speed gauge." Using a non-contact speed gauge may increase, and may in fact greatly increase, the frequency range over which accurate measurements can be made over the previous mechanical encoders. During the measurement, the capstan may be empty or not loaded with cable.

One or more measurements may be made by focusing the beam from the speed gauge, which may be referred to herein as a "spot," on the moving wheel or belt of the capstan 150. The analog output of the speed gauge may be routed to a dynamic signal analyzer 60 where an averaged FFT magnitude spectrum may be calculated and recorded. This may result in a detailed characterization of the amplitude versus frequency of periodic speed variation of the measured capstan 150.

To make the measurement, the laser spot may be directed to a surface that will move at the same speed as the cable component will move during production. For example, this may be the surface of the capstan wheel or the capstan belt. The capstan can be run at any arbitrary speed to make the measurement, as the final desired outcome is to quantify the amplitude of the variation-versus-wavelength for a number of machine speed values. The capstan speed is stabilized and the average speed of the capstan may be displayable on a display (not shown) of the laser speed gauge 50.

To get to the finished cable frequency Equation (1) is used.

$$F = \frac{f * 60 * C_{V_p}}{V * C_\lambda}$$ Equation (1)

Where:
F=frequency in the finished cable (MHz)
f=the frequency value to be converted (measured in Hz or sec$^{-1}$) [Or multiplied by 60 (sec/min) to convert to (min$^{-1}$)]
$C_{V_p}$=the half wave length velocity of propagation conversion factor from table 1
V=the surface velocity of the capstan wheel or belt being measured (feet/min)
$C_\lambda$=the wavelength (or velocity ratio) correction factor (dimensionless)

The measuring of the capstan 150 may be performed multiple times. For example, the measurement may be performed for the maximum and minimum production line speeds, and is may be repeated for the capstan running in the forward and reverse directions. Each of these measurements may be, as described above, analyzed and transformed into an FFT magnitude spectrum. The averaged magnitude spectra obtained can then be transferred to an output device, such as a graphical display on display unit 70.

By using measured line speed in the conversion equation, the magnitude of each driveline rotating device may be plotted at its own characteristic wavelength/frequency in the finished cable, regardless of the line speed at which the measurement is made. Making the measurement at several capstan or line speeds allows for the capstan behavior vs. line speed to be documented. To accomplish this regardless of capstan position and cable type, the transformation must take into account all the wavelength modifications that take place in that particular cable component downstream of the capstan, and also the velocity of propagation of the cable in question. Table 1 provides several correction factors.

TABLE 1

| Vp (%) | $C_{V_p}$ (MHz-ft) |
|---|---|
| 81.0 | 398.3 |
| 82.0 | 403.2 |
| 83.0 | 408.1 |
| 84.0 | 413.0 |
| 85.0 | 417.9 |
| 86.0 | 422.8 |
| 87.0 | 427.7 |
| 88.0 | 433.0 |
| 89.0 | 437.6 |
| 90.0 | 442.5 |
| 91.0 | 447.4 |
| 92.0 | 452.3 |

The resulting magnitude spectrum is then converted to electrical defect frequency in the finished cable by applying a transformation equation, discussed further herein. This electrical defect frequency may be compared with a return loss plot of a finished cable (measured separately and not illustrated herein). By comparing the transformed magnitude spectrum with a return loss plot of the finished cable, it may possible to identify which return losses are caused by that particular capstan. It is also possible to use the technique described herein to predict the finished cable defect frequency, regardless of cable design or location of capstan placement within the manufacturing process.

In some aspects, a wavelength correction factor is also applied. The wavelength correction factor in the equation is based on two observations:

The wavelength of any speed variation from a capstan is modified only by length modifying process steps operating on the component down-line of the capstan.

As the wavelength is elongated, the speed is increased proportionately. Also included is a correction factor to re-scale the frequency axis to account for cables with different velocities of propagation.

The wavelength/velocity correction factor is defined as equation (2).

$$C_\lambda = \frac{V_{out\ 1}}{V_{in\ 1}} * \frac{V_{out\ 2}}{V_{in\ 2}} * \frac{V_{out\ 3}}{V_{in\ 3}} \ldots * \frac{V_{out\ n}}{in\ n} \quad \text{Equation (2)}$$

Where:

$V_{out\ n}$=speed downstream of the nth downline speed modifying element $V_{in\ n}$=speed upstream of the nth downline speed modifying element This correction factor accounts for any elongation or shortening of the wavelength that takes place as the component is processed into finished cable. It is calculated by forming the product of all the speed change ratios of all wavelength modifying elements down-line of the capstan in question, and must encompass all down-line manufacturing steps for the component being manufactured.

The laser speed gauge 50 may be, in some instances, a Beta Laser-Mike or a Proton Laser Speed Gauge. The signal analyzer 60 may be a COGNITIVE VISION CV395 Dynamic Signal Analyzer.

The laser speed gauge 50 may be configured to deliver an analog output signal such that 1 Volt is equal to 100 feet per minute, though other relationships between the output voltage and the feed length are possible. The analyzer 60 may be set for AC coupling, which preserves the measured speed accurately down to about 0.5 Hz. The measurement process may be performed over a length of time and/or until collection of a predetermined number of samples has been performed. For example, in one aspect a length of time of approximately thirty seconds may be used and/or approximately 100 data samples may be collected. In some aspects, an operator may observe a real-time display of one or more of the devices and wait until a predetermined number of samples are collected, then discard such samples while waiting for the capstan to achieve speed of the capstan stabilizes. Once a representative sample has been assembled, the spectrum may be transmitted using one or more analyzer commands, such as a "save trace data" command and/or an "export trace data" command.

The data may be transmitted to a computing device where further frequency conversion is performed and the final graphs are constructed. In some aspects, the data, or resultant data, may be used to control the devices of the example cable assembly apparatus 100 (e.g., via the controller 102 illustrated therein).

Figure 4:
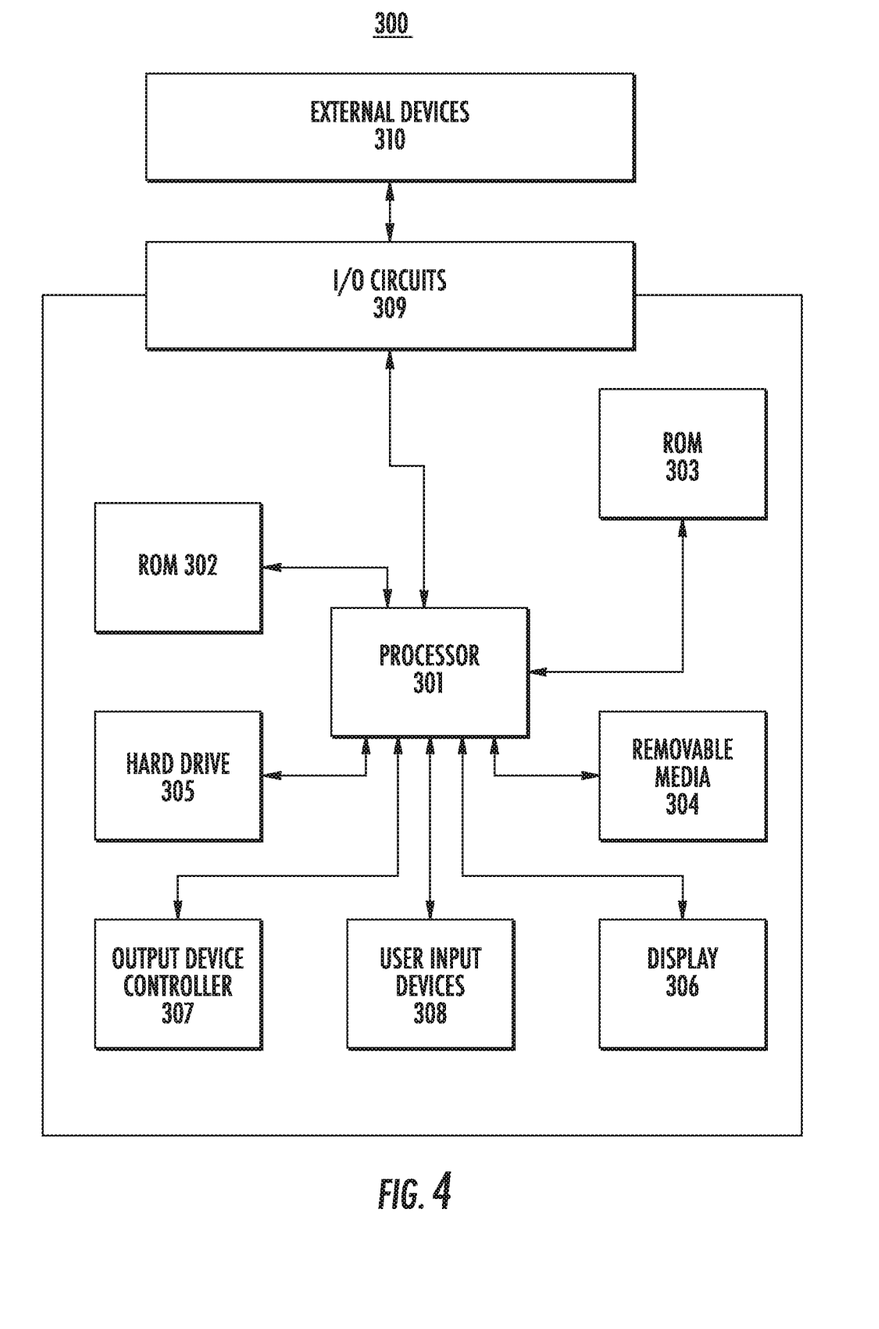
FIG. 4 illustrates hardware elements that can be used to implement any of the various computing devices discussed herein.

FIG. 4 illustrates hardware elements that can be used to implement any of the various computing devices discussed above. In some aspects, general hardware elements may be used to implement the various devices discussed herein, and those general hardware elements may be specially programmed with instructions that execute the algorithms discussed herein. In special aspects, hardware of a special and non-general design may be employed (e.g., ASIC or the like). Various algorithms and components provided herein may be implemented in hardware, software, firmware, or a combination of the same.

A computing device 300 may include one or more processors 301, which may execute instructions of a computer program to perform any of the features described herein. The instructions may be stored in any type of computer-readable medium or memory, to configure the operation of the processor 301. For example, instructions may be stored in a read-only memory (ROM) 302, random access memory (RAM) 303, removable media 304, such as a Universal Serial Bus (USB) drive, compact disk (CD) or digital versatile disk (DVD), floppy disk drive, or any other desired electronic storage medium. Instructions may also be stored in an attached (or internal) hard drive 305. The computing device 300 may include one or more output devices, such as a display 306, and may include one or more output device controllers 307, such as a display processor. There may also be one or more user input devices 308, such as a remote control, keyboard, mouse, touch screen, microphone, or the like. The computing device 300 may also include input/output circuits 309 which may include circuits and/or devices configured to enable the computing device 300 to communicate with external devices 310. The input/output circuits 309 may include one or more network interfaces, such as a network card, to enable to the computing device 300 to communicate with an external device via an external network (not shown). The network interface may be a wired interface, wireless interface, or a combination of the two. The external device may be a remotely located device. As discussed above, a computing device 300 may also include one or more device interfaces to enable the computing device 300 to communicate directly with one or more local devices, such as the laser speed gauge 50.

FIG. 5 is an exemplary process flowchart of analyzing a capstan using the system of FIG. 3. The method illustrated in FIG. 5 may commence at operation 401 upon selection of a measurement command by an operator. This operator may include instantiating the laser speed gauge 50 and pointing the speed gauge at a rotating surface of the capstan. As discussed above, it is preferable that the rotating surface rotates with the same speed as the cable to be carried by the capstan. Once the speed gauge is pointed at the capstan, a measurement of the capstan may be taken as discussed above. The measurement process may be performed over a length of time and/or until collection of a predetermined number of samples has been performed. For example, in one aspect a length of time of approximately thirty seconds may be used and/or approximately 100 data samples may be collected. In some aspects, an operator may observe a real-time display of one or more of the devices and wait until a predetermined number of samples are collected, then discard such samples while waiting for the capstan to achieve speed of the capstan stabilizes. Once a representative sample has been assembled, the spectrum may be transmitted using one or more analyzer commands, such as a "save trace data" command and/or an "export trace data" command.

In operation 403, the received measurement of the capstan may be converted to the frequency domain using, for example, an FFT of the received signal.

In operation 405, it is determined whether additional measurements are required. As discussed above, these measurements may be taken at different rotational speeds or directions of the capstan. If an additional measurement is required (YES branch from operation 705) the system proceeds to operation 407 and increases/decreases the speed of the capstan, or alters its rotational direction. If however additional measurements are not required (NO branch from operation 405) the system proceeds to operation 409. At operation 409, the received measurements may be averaged.

Figure 6:
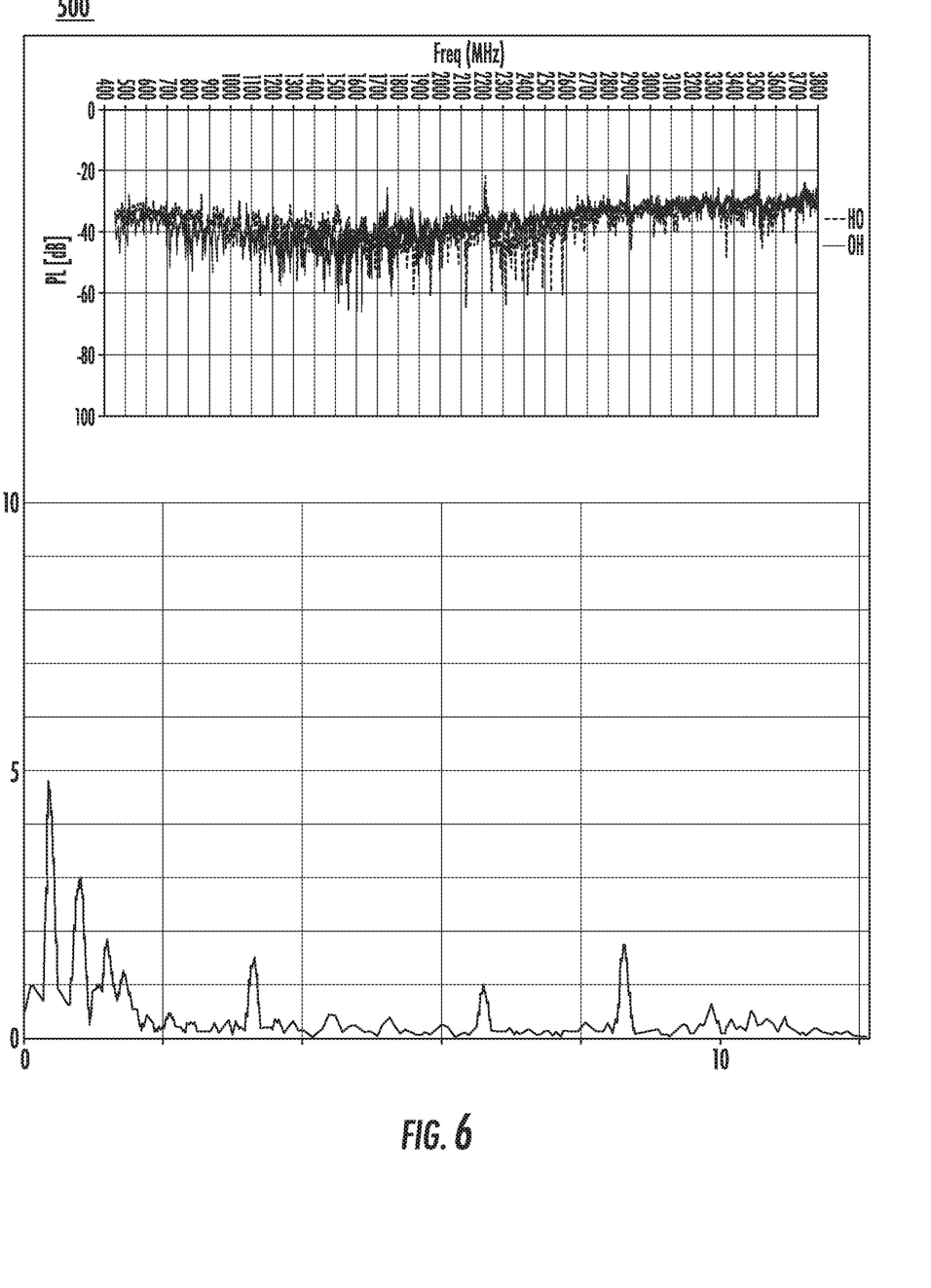
FIGS. 6-8 are exemplary outputs of the process of FIG. 5.

In operation 411, the system may perform a comparison with a frequency plot to identify defects in a cable manufactured on a production line where the capstan is installed. This may be, for example, with a finished cable return loss plot, as illustrated in FIG. 6. In FIG. 6, a comparison 500 of a measurement made on a capstan may be made with a finished cable return loss plot. The upper graph shows the return loss plot and the lower graph shows an map of the capstan. Spikes are observable in the return loss plot at 1100, 2200, and 2900 MHz. These spikes are identified as originating from the capstan. Additional spikes at 1760 and 3520 MHz are revealed as not associated with the capstan.

Figure 7:
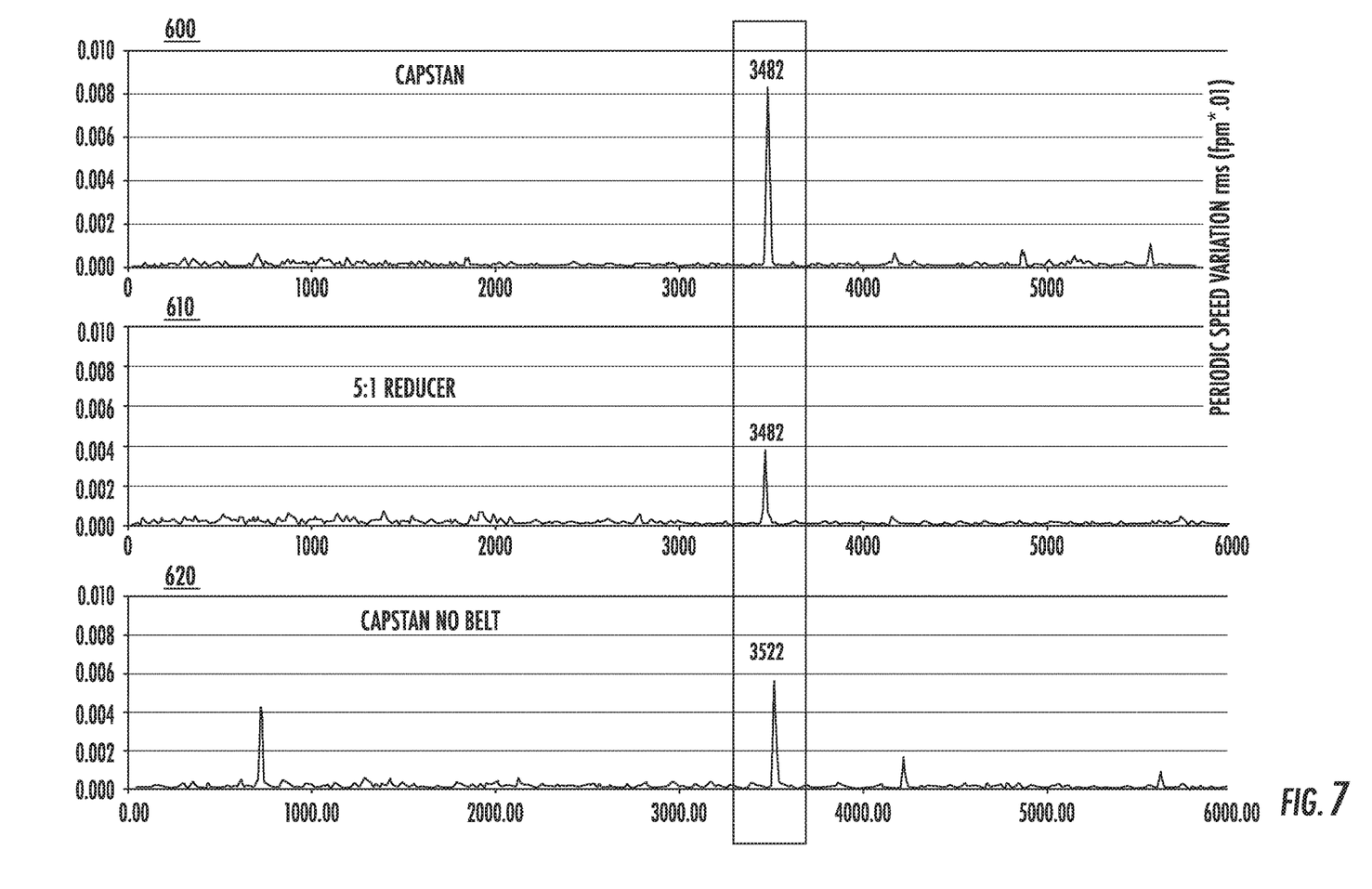

Additionally or alternatively, the comparator in operation 411 may be one or more traces of the capstan with different subcomponents installed, or other components of the capstan or assembly. For example, in FIG. 7, the upper trace 600 is a measurement taken of a capstan having a DC motor and 5 to 1 gear reducer. A large spike at 3482 MHz is observable, which is in an important LTE band. The middle trace 610 shows the measurement taken on the output drive pulley of the gear reducer attached to the motor while the capstan was running. The same spike at the output of this gear reducer is observable on trace 610. It is unclear if the spike was the result of from the 5 to 1 reducer, or was being coupled back to the 5 to 1 reducer from the reversing gearbox or another part of the gear train. However, in the lower plot 620, the measurement for the output of the same gear reducer is measured after the belt between the reducer and the reversing gearbox was removed, leaving only the motor and the gear reducer active in the measurement. This eliminated the coupling through the belt, and when a substantially similar spike was found in this trace 620, it is a strong indication that the capstan spike was coming from the 5 to 1 gear reducer. Resolution of the problem may include, for example, changing the gear reducer to a 15 to 1 gear reducer.

Figure 8:
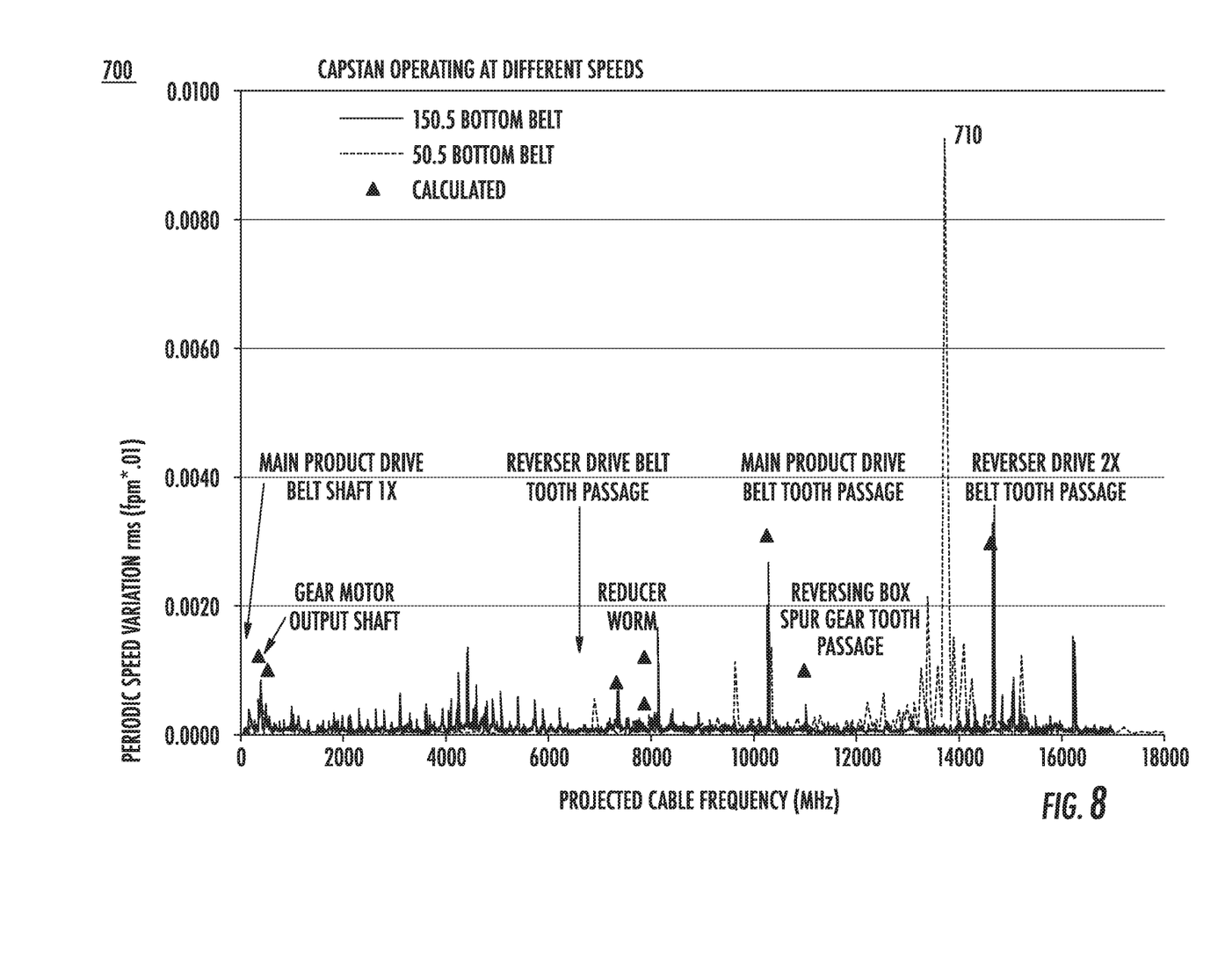

Another example of how measurement data can be used is shown in FIG. 8. Here the data 700 is shown for two different operating speeds of a capstan. In this case, the measurement revealed some unexpected behavior. At a lower speed, the data showed a large spike 710 at 13.5 GHz that does not show up at all when the capstan was operating at the higher line speed. In this plot it is also observable that the calculated rpm values of various rotating mechanisms correlate with the speed amplitude spikes measured on the capstan.

The laser Doppler speed gauge 50 discussed above has been found to capture an accurate speed signal for high frequencies. The methods provided herein, however, are not limited to such laser Doppler speed gauges. The methods and systems provided herein may also work and provide value in lower frequencies or lower frequency ranges and measurements may be made with encoders or other speed measurement devices. In some aspects, these devices may be high resolution/low mechanical mass encoders. As provided herein, methods and techniques for transforming a spectrum measured on a machine to a frequency domain (e.g., the cable frequency domain) may be used to transform or convert other spectra or spectra associated with other parameters. For example, other parameters for investigation may include a diameter of a conductor or an amount or diameter of extruded foam. Traces associated with these other parameters may be overlaid to show correlation.

For example, a speed variation of a capstan may cause a speed variation through a corrugator. This speed variation may be a cause of an outer conductor diameter variation, which may be apparent at a frequency that drives an impedance variation in the cable. The impedance variation may be apparent as a return loss spike that correlates to the speed and diameter variations. In some aspects, a speed variation of the corrugator may be shown graphically to be an underlying cause of the diameter variation that drives the impedance variation that drives the return loss spike and harmonics related to the return loss spike. In other words, in the present disclosure, the conversion of trace data to frequency domain is not limited or intended to be limited to laser speed gauge signals, and such conversion techniques and methods may be applied to other signals such as foamed insulation diameter, capacitance, conductor diameter, conductor thickness, and other signals.

Although many of the examples herein are in the context of investigating a single cable assembly component (e.g., a single capstan), it should be recognized that the devices, methods and techniques herein are not limited as such, and may be used to determine effects of speed interactions between two or more cable assembly components (e.g., a first capstan and a second capstan). For example, in some aspects, return loss spikes related to an interaction between two or more cable assembly components may be determined by first documenting behavior of each cable assembly component separately, which may in some aspects be with no load on the cable assembly components. Further documentation may then be generated of two or more cable assembly components under load and interacting with each other. The multiple frequency transformed speed traces may then be compared. This may, for example, reveal one or more control loop system related speed variations that may drive return loss spikes in a manufactured cable. In some aspects, such return loss spikes driven by one or more control loop system related speed variations may not be related to rotating equipment operating independently, but instead may be related to control systems and/or feedback control parameters based on interactions between the two or more cable assembly components. For example, in some aspects it may be possible for a first capstan operating alone to have no or limited oscillations, but have more severe oscillations when coupled to a second capstan due to interactions between the first capstan and the second capstan.

The methods and techniques provided above use rotational oscillations in examples, but the present application is not limited thereto. The techniques provided herein may be used to examine linear oscillations as well. For example, a capstan belt or a capstan may be mounted on a tower, which may have movements (e.g., bending back and forth). For example, a tower may be mounted in relative proximity to a compressor or other source of vibration in a floor to which the tower is mounted. Such movements or vibrations may induce a linear speed variation in a direction of line transport, which may result in a return loss spike in a cable. For example, if the tower to which the capstan is mounted bends in response to the compressor vibration, the linear motion of the tower may cause a speed variation in the cable carried by the capstan. It may be recognized that such a speed variation may occur in a first system state (e.g., when the compressor is in operation) and might not occur in a second system state (e.g., when the compressor is not in operation).

In some aspects, methods and systems described herein are being used on capstans that are running in production to help identify control system related speed variations that might result in finished cable problems. These sometimes occur only during production due to interactions between machines, and so these measurements are taken while the line is producing cable. By mapping base-line individual capstan data it is possible to better understand the variations measured during production. This makes identification of variations due to control instabilities easier to recognize. Periodic speed variations driving return loss spikes may be found by using the techniques described herein on capstans operating while the production line was running. Any observable spikes may be later eliminated by re-tuning control loop parameters of one or more capstans of the production line.

In some aspects, for example where an organization has one or more production lines or one or more facilities, a library of data may be generated and used to provide historical data regarding capstans or defects with capstans. This may be used as input to the above described processes for faster resolution of problems with capstans.

Aspects and elements of all of the embodiments disclosed above can be combined in any way and/or combination with aspects or elements of other embodiments to provide a plurality of additional embodiments.

In the drawings and specification, there have been disclosed typical embodiments of the detailed description and, although specific terms are employed, they are used in a generic and descriptive sense only and not for purposes of limitation. The following claims are provided to meet statutory requirements and do not set forth the scope of the invention.

The invention claimed is:

1. A method comprising:
receiving, by a computing device and from a laser speed gauge, a first reading of a cable assembly component on which a cable component is being wound or unwound during a cable manufacturing process;
converting, by the computing device, the first reading of the cable assembly component to a frequency analysis of the cable assembly component; and
identifying, based on the frequency analysis of the cable assembly component, a structural defect in a cable caused by winding or unwinding of the cable component on the cable assembly component, wherein identifying the structural defect in the cable caused by the cable assembly component comprises comparing the frequency analysis of the cable assembly component with a frequency analysis of the cable.

2. The method of claim 1, further comprising:
receiving, by the computing device, a second reading of the cable assembly component; and
converting, by the computing device, the second reading of the cable assembly component to a further frequency analysis of the cable assembly component,
wherein identifying the structural defect is based on the frequency analysis and the further frequency analysis.

3. The method of claim 2, wherein the identifying is based on an average of the frequency analysis of the cable assembly component and the further frequency analysis.

4. The method of claim 2, wherein the first reading of the cable assembly component is associated with a first rotational speed of the cable assembly component, and wherein the second reading of the cable assembly component is associated with a second rotational speed of the cable assembly component different from the first rotational speed.

5. The method of claim 1, wherein the frequency analysis of the cable comprises analysis of the cable over a range of frequencies that includes a Long-Term Evolution (LTE) frequency.

6. The method of claim 1, wherein the cable assembly component comprises a capstan.

7. A method comprising:
receiving, by a computing device and from a laser speed gauge, a first reading of a cable assembly component;
converting, by the computing device, the first reading of the cable assembly component to a frequency analysis of the cable assembly component; and
receiving, by the computing device, a second reading of the cable assembly component; and
converting, by the computing device, the second reading of the cable assembly component to a further frequency analysis of the cable assembly component,
determining a structural defect in a cable caused by the cable assembly component, wherein the determining of the structural defect in the cable caused by the cable assembly component is based on the frequency analysis of the cable assembly component, the further frequency analysis of the cable assembly component, and a comparison of the frequency analysis of the cable assembly component with a frequency analysis of the cable.

8. The method of claim 7, wherein the determining of the structural defect in the cable caused by the cable assembly component is based on an average of the frequency analysis of the cable assembly component and the further frequency analysis.

9. The method of claim 7, wherein the first reading of the cable assembly component is associated with a first rotational speed of the cable assembly component, and wherein the second reading of the cable assembly component is associated with a second rotational speed of the cable assembly component different from the first rotational speed.

10. The method of claim 9, wherein the frequency analysis of the cable comprises analysis of the cable over a range of frequencies that includes a Long-Term Evolution (LTE) frequency.

11. The method of claim 7, wherein the cable assembly component comprises a capstan.

12. A system comprising:
a computing device comprising a processor and memory coupled to the processor; and
a laser speed gauge;
wherein the memory stores non-transitory computer readable instructions that when executed by the processor cause the processor to perform operations comprising:
receiving, from the laser speed gauge, a first reading of a cable assembly component on which a cable component is being wound or unwound during a cable manufacturing process;
converting the first reading of the cable assembly component to a frequency analysis of the cable assembly component; and
identifying, based on the frequency analysis of the cable assembly component, a structural defect in a cable caused by winding or unwinding of the cable component on the cable assembly component, wherein identifying the structural defect in the cable caused by the cable assembly component comprises comparing the frequency analysis of the cable assembly component with a frequency analysis of the cable.

13. The system of claim 12, wherein the cable assembly component comprises a capstan.

* * * * *

UNITED STATES PATENT AND TRADEMARK OFFICE
CERTIFICATE OF CORRECTION

PATENT NO. : 10,890,613 B2  
APPLICATION NO. : 16/189316  
DATED : January 12, 2021  
INVENTOR(S) : Alan N. Moe Page 1 of 1

It is certified that error appears in the above-identified patent and that said Letters Patent is hereby corrected as shown below:

In the Claims

Column 13, Line 46, Claim 2: Please correct "analysis and the further" to read -- analysis of the cable assembly component, the frequency analysis of the cable, and the further --

Signed and Sealed this  
Eleventh Day of May, 2021

Drew Hirshfeld  
*Performing the Functions and Duties of the*  
*Under Secretary of Commerce for Intellectual Property and*  
*Director of the United States Patent and Trademark Office*